United States Patent
Grouffal et al.

(10) Patent No.: US 7,584,043 B2
(45) Date of Patent: Sep. 1, 2009

(54) RESYNCHRONIZATION OF TEMPORALLY ACQUIRED ENGINE SIGNALS

(75) Inventors: Christian Grouffal, Rueil Malmaison (FR); Gérard Thierry, Nanterre (FR)

(73) Assignee: Institut Francais du Petrole, Rueil Malmaison Cedex (FR)

( * ) Notice: Subject to any disclaimer, the term of this patent is extended or adjusted under 35 U.S.C. 154(b) by 69 days.

(21) Appl. No.: 11/955,480

(22) Filed: Dec. 13, 2007

(65) Prior Publication Data

US 2008/0162013 A1 Jul. 3, 2008

(30) Foreign Application Priority Data

Dec. 15, 2006 (FR) .................................. 06 10996

(51) Int. Cl.
*F02D 35/02* (2006.01)
*G06F 19/00* (2006.01)

(52) U.S. Cl. .................................... 701/101; 73/117.03

(58) Field of Classification Search ......... 701/101–102, 701/110, 115; 73/117.03, 114.03, 116, 118.01
See application file for complete search history.

(56) References Cited

U.S. PATENT DOCUMENTS

| | | | |
|---|---|---|---|
| 4,338,813 A * | 7/1982 | Hunninghaus et al. | ... 73/114.27 |
| 5,623,412 A | 4/1997 | Masson et al. | |
| 6,679,108 B2 * | 1/2004 | Robertson et al. | ........ 73/114.03 |
| 6,868,833 B2 * | 3/2005 | Friedrich et al. | ............ 123/479 |

FOREIGN PATENT DOCUMENTS

| | | |
|---|---|---|
| EP | 0 647 774 A1 | 4/1995 |
| GB | 2 344 890 A | 6/2000 |

* cited by examiner

*Primary Examiner*—Hieu T Vo
(74) *Attorney, Agent, or Firm*—Antonelli, Terry, Stout & Kraus, LLP.

(57) ABSTRACT

An method of synchronizing a signal coming from at least one sensor positioned on an engine with a periodic event of the engine such as the crankshaft rotation is disclosed having application for engine control. A crankshaft rotation signal indicative of a reference time (TR), with which the engine signal(s) is to be synchronized, is acquired. The effective time difference (D) between the reference time and the time that is the closest to each temporally acquired engine signal is measured. Then the coefficients of a fractional digital compensation filter (FSDF) for compensating for the fractional part (d) of the measured effective time difference are determined. Finally, this digital compensation filter is applied to each temporally sampled engine signal, allowing obtaining of a series of digitized samples resealed from reference time (TR) for each engine signal.

16 Claims, 1 Drawing Sheet

RESYNCHRONIZATION OF TEMPORALLY ACQUIRED ENGINE SIGNALS

BACKGROUND OF THE INVENTION

1. Field of the Invention

The present invention relates to the field of engine analysis and control, and more particularly to the field of acquisition of a signal coming from at least one sensor positioned on an engine.

2. Description of the Prior Art

The various applications on engine test benches require acquisition of physical quantities (pressures, temperatures, flow rates, etc.). An engine under test is thus equipped with sensors, each one delivering a voltage or a current in analog form to one or more data acquisition or engine control systems.

Conventionally, the analog signal from the sensor is first conditioned. It therefore generally undergoes voltage conversion, amplification and filtering.

The analog signal obtained is then digitized by means of an analog-to-digital converter delivering samples generally coded at 12, 14 or 16 bits. In the field of engine signal acquisition, that is signals coming from sensors positioned on an engine, the conversion trigger signal depends on the crankshaft rotation and it generally comes from either an angular coder located at the end of the crankshaft, or from an engine target wheel (58X or other) also positioned at the end of the crankshaft. Thus, analog-to-digital conversion of the signals can be carried out every 6 crank angle degrees, every crank angle degree or every 1/10 crank angle degree. The sequence of the various samples obtained is then used to calculate various parameters useful for combustion analysis or engine control. These calculations can be made either on one engine cycle corresponding to one or more crankshaft rotations, or on several engine cycles.

However, some calculations require temporal sampling so as to meet the sampled signal theory. These calculations are based on signal processing algorithms (Fourier transforms, filtering, wavelet transforms, etc.). Noise analysis can be mentioned for example. Thus, the signal coming from a sensor requires two samplings: temporal sampling and sampling synchronized with the engine rotation.

However, it is often necessary, for some calculations such as combustion analysis or TDC (top dead center) calibration, to correlate the temporal position of a sample with the angular position of the crankshaft. This reconstructs, from a temporal acquisition and from a crankshaft rotation signal, the sequence of samples as if they resulted from a sampling synchronized with the crankshaft rotation. This operation currently involves complex sample dating means, whether hardware or software.

The following document describes a technique allowing, by means of calculations, recalibration of or resealing of signals in time:

Laakso T. I. et al, "*Splitting the Unit Delay*", in IEEE Signal Processing Magazine, 1996.

However, this fractional delay (smaller than unity) processing technique describes an ideal filter that cannot be implemented for engine control or test bench applications because its impulse response is infinitely long.

SUMMARY OF THE INVENTION

The invention is a method allowing synchronization of a signal from a sensor positioned on or associated with an engine with a periodic event of the engine, such as the crankshaft rotation, in a sufficiently fast way to be used in engine applications.

The invention relates to an engine control method wherein a signal S(t) characterizing engine operation is acquired from a sensor positioned on the engine and this signal S(t) is synchronized with a periodic event of the engine. The method comprises the following stages:

producing a first series of samples $E(t_i)$ by digitizing and by sampling the engine signal S(t) at times $t_i$;

acquiring a synchronization signal indicative of a reference time (TR) that is a function of the periodic event of the engine;

measuring an effective time difference D between reference time (TR) and a most recent time (TP) among the times $t_i$;

calculating coefficients of a fractional digital filter (FSDF) to compensate for the effective time difference, the coefficients being sufficient to obtain a fixed time compensation precision;

applying the filter to first series of samples $E(t_i)$ to obtain a second series of digitized samples $E_{sync}(t_i)$ resealed from reference time (TR) and controlling the engine according to the second series of samples $E_{sync}(t_i)$.

Calculation of the fractional filter coefficients can involve determining ripple margins of the amplitude $\Delta D$ and of phase a as a function of a maximum temporal error $E_M$ affecting the signal delayed by the filter $E_{sync}(t_i)$ by applying the relation as follows:

$$E_M \approx \sqrt{[(\Delta D)^2 + (a)^2]}$$

Calculation of the fractional filter coefficients can involve the following stages:

precalculating values of the coefficients of N intermediate digital filters (F1 to FN) to compensate for N effective time difference values distributed over a duration of a sampling interval of the signal S(t) coming from the engine by means of an analog-to-digital converter and storing these filter coefficients;

calculating the coefficients of the fractional digital filter (FSDF) by interpolation between the coefficients of the series of filtering coefficients associated with the closest difference values.

According to the invention, the digital filter coefficients can be calculated by means of a Lagrange interpolation.

Finally, the synchronization signal can be a signal depending on the crankshaft rotation.

BRIEF DESCRIPTION OF THE DRAWING

Other features and advantages of the method according to the invention will be clear from reading the description hereafter of embodiments given by way of non limitative example, with reference to FIG. 1 illustrating resealing of a series of samples.

DETAILED DESCRIPTION

Figure 1:
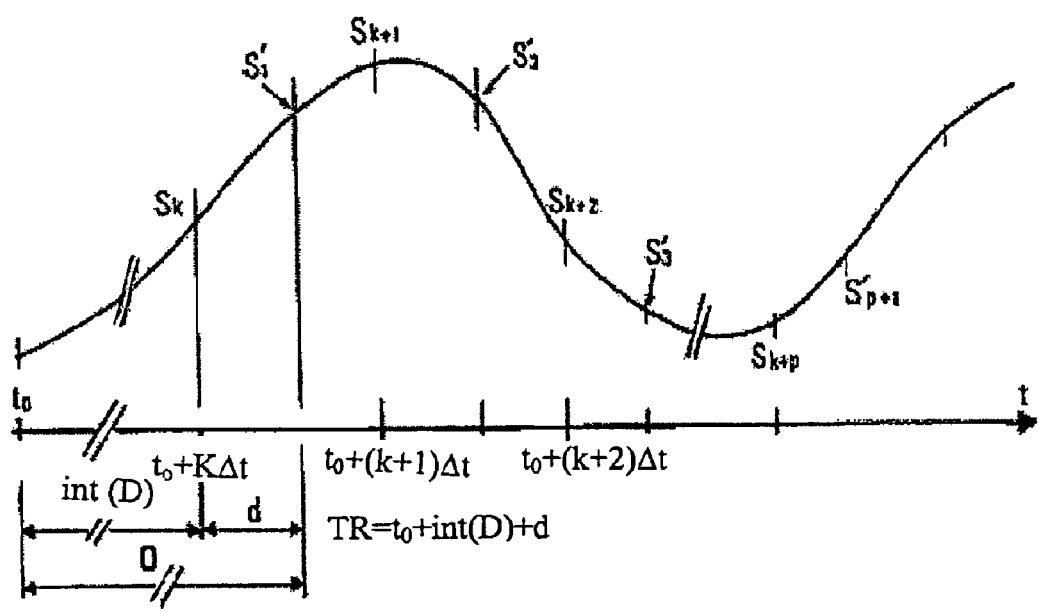

The invention is a method for synchronizing a signal coming from a sensor positioned on an engine with a periodic event of the engine such as the crankshaft rotation.

An analog signal that measures directly or indirectly physical quantities such as the pressures in the cylinders, temperatures, flow rates, etc., is first acquired by means of a sensor positioned on an engine. An accelerometer can for example be arranged on the engine block, or a sensor measuring the instantaneous engine speed at the end of the transmission, or a sensor positioned on the exhaust circuit and measuring the fuel/air ratio in the exhaust gas can be utilized. In general terms, these sensors deliver a voltage or a current in analog form to one or more engine control or data acquisition systems. This stage provides an analog signal S(t) as a function of time t.

Then, the acquired analog signal S(t) is digitized to permit interpreted by means of electronic engine control or combustion analysis devices. This digitizing is achieved by a trigger signal. According to the invention, this conversion trigger signal depends on the time t. Thus, as a function of time, a signal is sent to a digital converter to obtain samples as a function of time from analog signal S(t). This stage provides a sequence of samples $E(t_i)$, where E represents the digitized value of signal S(t), $t_i$, represents a time. A value $E(t_i)$ thus corresponds to the digitized value of signal S(t) at the time $t_i$. Thus a sampled signal for the times $t_1, t_2, \ldots, t_n$: $E(t_1)$, $E(t_2), \ldots, E(t_n)$ is obtained.

Finally, the digital signal thus sampled in time $E(t_i)$ is synchronized, for example, from a reference time (TR) that is a function of the crank angle α. This stage can be divided up into four main phases:

1. Acquisition of a synchronization signal indicative of this reference time (TR);
2. Measurement of the effective time difference (D) between reference time (TR) and the most recent time (TP) among the $t_i$;
3. Construction of a fractional digital filter (FSDF) to compensate for the measured effective time difference (D); and
4. Application to the series of samples $E(t_i)$ of the fractional digital compensation filter (FSDF) so as to obtain a series of digitized samples $E_{sync}(t_i)$ resealed from reference time (TR).

These stages are described in detail hereafter.

1—Acquisition of a Synchronization Signal

It is thus first necessary to acquire a synchronization signal indicative of a reference time (TR) to which the digital signal $E(t_i)$ sampled in time is to be synchronized. A crankshaft rotation signal sampled as a function of time can be used. This is conventionally achieved from either an angular coder located at the end of the crankshaft, or from an engine target wheel (58X or other) also positioned at the end of the crankshaft. Thus a sequence of samples $α(t'_i)$ is obtained where a represents the crank angle and $t'_i$ represents a time. A value $α(t'_i)$ thus corresponds to the value of the crank angle at the time $t'_i$. Thus a sampled signal is obtained for the times $t'_1, t'_2, \ldots, t'_m$: $α(t'_1), α(t'_2), \ldots, α(t'_m)$.

Then, synchronization is performed from a reference time (TR). This time depends on signal $α(t'_i)$. For example, when the sampled crankshaft rotation signal $α(t'_i)$ indicates that the crank angle has a value α(TR), a signal is sent to synchronize signal $E(t_i)$ sampled in time with the crankshaft rotation $α(t'_i)$. A series of samples $E_{sync}(t_i)$, rescaled from reference time TR, thus is to be obtained from the first series $E(t_i)$ of digitized samples of the engine signal produced from any initial time $(t_1)$ prior to reference time (TR).

2—Measurement of the Time Difference (D) Between Reference Time (TR) and the Most Recent Time The most recent digitized temporal sample E(TP) is determined in relation to reference time TR, that is the sample from among samples $E(t_1), E(t_2), \ldots, E(t_n)$ for which $t_i$ is the closest to TR. Sample E(TP) is the sample that is temporally the closest to sample α(TR).

The effective time delay, denoted by D, between reference time TR and the most recent time TP is then calculated: D=TR−TP.

3—Calculation of Coefficients of a Fractional Digital Filter (FSDF)

According to the invention, the measured effective time difference (D) is compensated for by constructing a fractional delay filter (FSDF) that is applied to the series of samples $E(t_i)$. The coefficients of this filter are in sufficient number to obtain a fixed time compensation precision.

Principle

The principle is illustrated by FIG. 1. The quantity x[n] designates a series of digitized samples $S_k, S_{k+1}, S_{k+2} \ldots S_{k+p}$ obtained from a measuring signal from an initial time $t_0$, with a sampling interval Δt, by an analog-to-digital converter, and y[n] designates a series of samples $S'_1, S'_2, S'_3 \ldots S'_{P+1}$ taken with the same interval from the same measuring signal, but resealed in time from a reference time $T_R$ subsequent to $t_0$. The recalibration time difference D is a positive real number. The relationship is: y[n]=x[n−D].

Generally, delay D can be split up into an integral part (integral number of samples) and a fractional part:

$$D=int(D)+d$$

where int(D) corresponds to an integral number of sampling periods and d is a fraction of a period.

The initial signal x[n] just has to be delayed by a simple translation to obtain a delay int(D). The samples of y[n] are those of x[n] whose suffix has simply been shifted (renumbered) by int(D). The sample bearing number k in the first series for example becomes sample 1 in the second series, with k. Δt=int(D). For the fractional part of this time difference, the recalibrated samples y[n] will be somewhere between the values of x[n] at two successive sampling positions by the local clock and they have to best correspond to the effective amplitudes of the sampled signals at these intermediate positions. This shift with resealing can be obtained by applying a digital filtering $H_{id}$.

With the well-known notations specific to the Z-transform, this shift by digital filtering can be formulated as follows: $Y(z)=X(z).z^{-D}$.

The frequency response of the ideal filter $H_{ID}$ is: $H_{id}=z^{-D}=e^{-j\omega D}$ with $z=e^{-j\omega}$.

The amplitude and phase responses of the ideal filter for any ω are thus:

$$|H_{id}(e^{j\omega})|=1 \text{ and } \arg[H_{id}(e^{j\omega})]=\theta_{id}(\omega)=-D\omega$$

The phase is often represented in form of a phase delay defined by:

$$\tau_p(\omega)=-\frac{\theta_{id}(\omega)}{\omega},$$

a delay that is here equal to D.

The corresponding impulse response is obtained by means of an inverse Fourier transform:

$$h_{id}[n] = \frac{1}{2\pi}\int_{-\pi}^{\pi} H_{id}(e^{j\omega})e^{j\omega n\Delta t}d\omega$$

for any n, hence:

$$h_{id}[n] = \frac{\sin[\pi(n\Delta t - D)]}{\pi(n\Delta t - D)} = \mathrm{sinc}(n\Delta t - D)$$

for any n.

This ideal filter $H_{ID}$, which is described in Laakso T. I. et al. (mentioned above), cannot be implemented because its impulse response is infinitely long. According to the invention, a fractional-sample delay filter (FSDF) is then used to come sufficiently close to this ideal solution for the recalibration or resealing precision to remain compatible with the precision expected in practice.

Constraints

Solving the problem then implements a fractional-sample delay filter having well-defined constraints according to the application. In fact, the filtering method meets requirements linked with the engine application: pass-band of the signals to be acquired, sampling frequency, technical limitations of the means for applying the digital filtering (calculation means) available and expected precision for the calculation of the recalibrated samples.

Calculation of the Fractional Filter Coefficients

The method is based on the construction of a fractional-sample delay filter (FSDF) via the calculation of its coefficients. This calculation is based on the ideal filter defined above ($H_{ID}$).

The point-by-point maximum temporal error $E_M$ between the shifted signal calculated by the filter and the ideal shifted signal (for which $E_M=0$) can be expressed by the relation:

$$E_M \approx \sqrt{[(\Delta D)^2 + (a)^2]} \quad (1)$$

with:
ΔD the ripple margin within the pass-band as regards the phase,
a the ripple margin within the pass-band as regards the amplitude, provided that the signal is in the frequency band below the filter cut-off frequency.

Knowing this relation between the maximum error and the filtering characteristics, a known FIR (Finite Impulse Response) filter design method giving the suitable filter coefficients is then selected. FIR filters are non-recursive filters without feedback. The digital system appears as a window centered on the N most recent samples. This filter has a memory of length N. A known method for such a filter is the Lagrange interpolation method. For example reference is made to the following document:

OONO Y, 1996, "Formulation of the Design of FIR Filters on the Basis of the Lagrange Interpolation Formula", International Journal of Circuit Theory and Applications, 1996, vol. 24, no5, pp. 581-585.

If for example an analog-to-digital converter working with 16 bits including one sign bit is used, the error can be imposed which is at most equal to one quantizing step, i.e. $2^{-15} \approx 10^{-5}$.

For an error of $10^{-5}$, a has to be of the order of $10^{-5}$, which imposes that the ripple margin |H| of the filtering function is such that: $1-a \leq |H| \leq 1+a$. Since a is very small, it can be readily shown that this inequality is equivalent to: $-10^{-5} \leq |H|_{dB} \leq 10^{-5}$. The same relation shows that $-10^{-5} \leq |H|_{dB} \leq 10^{-5}$ also has to be of the order of $10^{-5}$.

With the previous specifications, suitable for engine control applications, processing of engine signals sampled at 0.1 crank angle at 6000 rpm imposes, for temporal sampling, a minimum pass-band of 333 KHz. For example, assume the following discussion hypothesis:

cut-off frequency is characterized by two values, 375 KHz and 420 KHz;

oscillations are in the [0-375 KHz] frequency band below 0.05 dB;

oscillations are in the [0-420 KHz] frequency band below 0.2 dB;

phase cut-off frequency equal to 375 KHz and for oscillations in the [0-375 KHz] frequency band below a delay corresponding to a temporal delay of 0.01 μs, the phase specification corresponding to 0.01 μs for a sampling frequency of 1000 KHz (therefore a temporal period of 1 μs) gives a fractional delay of $0.01/2=10^{-2}$.

It can be determined that these amplitude and phase constraints are greatly satisfied if the error that is imposed is below $10^{-5}$.

Then the value of the shift filter coefficients has to be determined, considering the imposed limitations, by selecting as mentioned above from among known filter design methods. The simplest method of implementing a fractional delay filter uses the Lagrange interpolation method providing a very good frequency response and a very flat amplitude response for low frequencies, but the resulting filter has a very narrow pass-band that does not vary much with the order of the filter. There are also well-known temporal windowing methods (Kaiser, Dolph-Tchebichev, Blackman, Hamming window, etc.). Another known method, referred to as least-squares method, essentially minimizes the frequency error between the ideal filter $H_{ID}$ and the implemented FSDF filter. The calculating programs required for calculation of the filtering coefficients according to these various methods are often available in known signal processing software libraries such as, for example, Matlab™.

For each particular value of the delay, a resampling allowing an approximation with a precision of the order of $10^{-7}$ requires calculation of a filter defined by several tens of filtering coefficients. Sixty are for example necessary with the generalized least-squares method to reach a precision of this order.

The fractional-sample delay filter (FSDF) compensates for the measured effective time difference, the coefficients being in sufficient number to obtain a fixed time compensation precision.

4—Application of the Fractional-Sample Delay Filter (FSDF)

By applying the FSDF filter to samples $E(t_i)$, the series of samples $E_{sync}(t_i)$ synchronized with reference time (TR) is obtained.

This method thus gives an estimation of the samples of the signal, which represents the real signal if, in the system design, the allowable error margin is lower than the converter precision.

Application

The design of the fractional-sample delay filter meeting the aforementioned constraints (pass-band of the signals to be acquired, sampling frequency, . . . ) leads, on the one hand, to a large number of coefficients and, on the other hand, to coding of the coefficients in form of 32-bit floating point numbers. The calculations allowing obtaining the output samples from the measurement of delay D and the filter input samples also have to be carried out with 32-bit floating point numbers. Besides, the calculations have to be made upon each request for synchronization with the engine rotation signal.

Whatever the method used for the design of the fractional-sample delay filter, the longest calculating times are for determination of the filter coefficients because these calculations involve either a large number of operations or trigonometric mathematical functions, or matrix calculations. It is therefore impossible to calculate these coefficients in real time. In fact, for an angular sampling at $1/10°$ and at 6000 rpm, an output sample has to be delivered every 2.8 µs. The solution chosen here therefore pre-calculates the coefficients of the filter for a limited number of values of D. About ten values of D, evenly or unevenly distributed between 0 and 1, can be taken for example. These values are stored in form of a table in the hardware or the software of the system (10 in the case mentioned by way of example). The filter coefficients evolving monotonously as a function of D, the values of the filter coefficients are calculated by interpolation from the closest table. By way of example, a Lagrange interpolation of order 5 gives satisfactory results in accordance with the constraints of the problem. Then, the convolution of the input samples with the determined coefficients is implemented by means of a series of additions-multiplications. This implementation can be done in a purely hardware manner, in a logic gate array programmable by the user, referred to as FPGA (field programmable gate array), or in a purely software manner in a digital signal processor (DSP), that is a processor specially designed for high-rate and real-time processing of digital signals resulting from the conversion of analog signals.

The above principle allows acquisition of data specific to the engine upon cold start-up. In fact, angular synchronization signals are available only after one or two engine cycles. It is therefore impossible to sample the signal from the start. However, the angular synchronization signals can be reconstructed a posteriori. Through temporal acquisition and storage of the temporal samples in the memory, the system can then deliver angularly synchronized samples using the method described above.

The above principle also allows obtaining higher angular sampling precision during low engine speeds or idle speed. In fact, the method can apply for angular samplings below $1/10$ crank angle.

Finally, the invention has been described within the context of synchronization with the crank angle, but any other synchronization signal useful for engine control or combustion analysis can be used as the basis for this synchronization. The method allows resynchronizing samples acquired temporally by any other external signal from a sensor installed on the engine (camshaft for example) or from an external clock working at a sampling frequency that is different from the sampling frequency of the sensor. Consequently, it is possible to completely uncouple the temporal acquisition of the sensors and to consider using any temporal sampling frequency for the sensors, different from one sensor to the next, but a set of coherent signals, perfectly angularly resynchronized or resampled in time, has to be provided to the engine control or acquisition system.

The invention claimed is:

1. A method of controlling an engine, wherein a signal characterizing operation of the engine is acquired from a sensor associated with the engine and the signal is synchronized with a periodic event of the engine, comprising:
   producing a first series of samples by digitizing and sampling the signal at different times;
   acquiring a synchronization signal indicative of a reference time that is a function of the periodic event of the engine;
   measuring a time difference between the reference time and a most recent sample of the first series of samples;
   calculating coefficients of a fractional digital filter for providing compensation for the time difference wherein the coefficients permit obtaining a fixed time compensation precision;
   applying the first series of samples to the fractional digital filter with the calculated coefficients to obtain a second series of digitized samples rescaled from the reference time; and
   controlling the engine according to the second series of samples.

2. A method as claimed in claim 1, wherein calculation of the coefficients of the fractional digital filter determines ripple margins of an amplitude $\Delta D$ and of phase a as a function of a maximum temporal error $E_M$ affecting the signal delayed by the filter $E_{sync}(t_i)$ by applying the relation as follows:

$$E_M \approx \sqrt{[(\Delta D)^2 + (a)^2]}.$$

3. A method as claimed in claim 2, wherein calculation of the fractional filter coefficients comprises:
   precalculating values of the coefficients of N intermediate digital filters for compensating for N effective time difference values distributed over a duration of a sampling interval of the signal acquired from the sensor using an analog-to-digital converter and storing the filter coefficients; and
   calculating the coefficients of the fractional digital filter by interpolation between coefficients of a series of filtering coefficients associated with closest difference values.

4. A method as claimed in claim 3, wherein the coefficients of the fractional digital filter are calculated by means of a Lagrange interpolation.

5. A method as claimed in claim 4, wherein the synchronization signal is a signal dependent on crankshaft rotation.

6. A method as claimed in claim 2, wherein the coefficients of the fractional digital filter are calculated by means of a Lagrange interpolation.

7. A method as claimed in claim 6, wherein the synchronization signal is a signal dependent on crankshaft rotation.

8. A method as claimed in claim 2, wherein the synchronization signal is a signal dependent on crankshaft rotation.

9. A method as claimed in claim 3, wherein the synchronization signal is a signal dependent on crankshaft rotation.

10. A method as claimed in claim 1, wherein calculation of the fractional filter coefficients comprises:
    precalculating values of the coefficients of N intermediate digital filters for compensating for N effective time difference values distributed over a duration of the sampling interval of the signal acquired from the sensor using an analog-to-digital converter and storing the filter coefficients; and calculating the coefficients of the fractional digital filter by interpolation between coefficients of a series of filtering coefficients associated with closest difference values.

11. A method as claimed in claim 10, wherein the coefficients of the fractional digital filter are calculated by means of a Lagrange interpolation.

12. A method as claimed in claim 11, wherein the synchronization signal is a signal dependent on crankshaft rotation.

13. A method as claimed in claim 10, wherein the synchronization signal is a signal dependent on crankshaft rotation.

14. A method as claimed in claim 1, wherein the coefficients of the fractional digital filter are calculated by means of a Lagrange interpolation.

15. A method as claimed in claim 14, wherein the synchronization signal is a signal dependent on crankshaft rotation.

16. A method as claimed in claim 1, wherein the synchronization signal is a signal dependent on crankshaft rotation.

* * * * *